(12) United States Patent
Yu et al.

(10) Patent No.: US 8,203,209 B2
(45) Date of Patent: Jun. 19, 2012

(54) BOND PAD DESIGN FOR REDUCING THE EFFECT OF PACKAGE STRESS

(75) Inventors: Chen-Hua Yu, Hsin-Chu (TW);
Shin-Puu Jeng, Hsin-Chu (TW);
Hao-Yi Tsai, Hsin-Chu (TW);
Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 12/813,763

(22) Filed: Jun. 11, 2010

(65) Prior Publication Data

US 2011/0031618 A1 Feb. 10, 2011

Related U.S. Application Data

(60) Provisional application No. 61/232,076, filed on Aug. 7, 2009.

(51) Int. Cl.
*H01L 23/498* (2006.01)

(52) U.S. Cl. ............... 257/738; 257/E23.069; 257/737; 257/734; 257/778

(58) Field of Classification Search .................. 257/738, 257/737, 734, 778, E23.069
See application file for complete search history.

(56) References Cited

U.S. PATENT DOCUMENTS

| | | | |
|---|---|---|---|
| 2008/0224326 A1* | 9/2008 | Kuo et al. | 257/780 |
| 2009/0065871 A1* | 3/2009 | Lin et al. | 257/368 |
| 2011/0115073 A1* | 5/2011 | Chen | 257/737 |
| 2011/0143531 A1* | 6/2011 | Chyi | 438/614 |
| 2011/0210443 A1* | 9/2011 | Hart et al. | 257/738 |

* cited by examiner

*Primary Examiner* — A. O. Williams
(74) *Attorney, Agent, or Firm* — Slater & Matsil, L.L.P.

(57) ABSTRACT

An integrated circuit structure includes a semiconductor substrate, and an active device formed at a front surface of the semiconductor substrate. A bond pad is over the front surface of the semiconductor substrate. The bond pad has a first dimension in a first direction parallel to the front surface of the semiconductor substrate. A bump ball is over the bond pad, wherein the bump ball has a diameter in the first direction, and wherein an enclosure of the first dimension and the diameter is greater than about −1 μm.

15 Claims, 4 Drawing Sheets

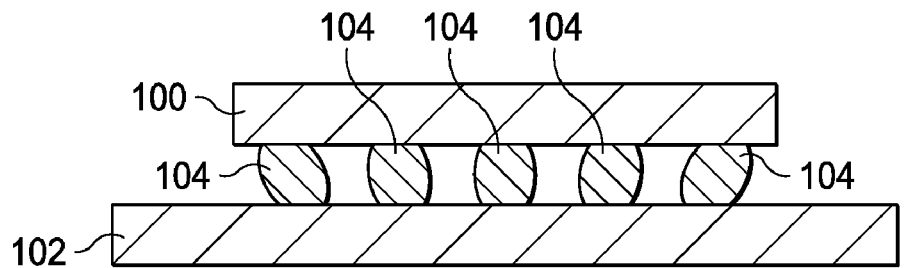
FIG. 1
(PRIOR ART)
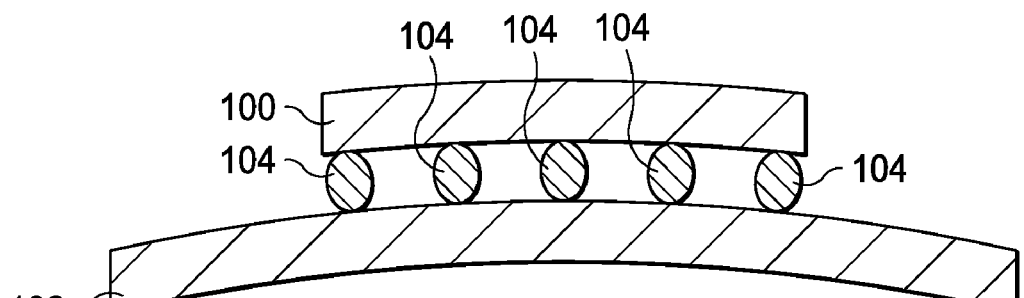
FIG. 2
(PRIOR ART)
FIG. 4
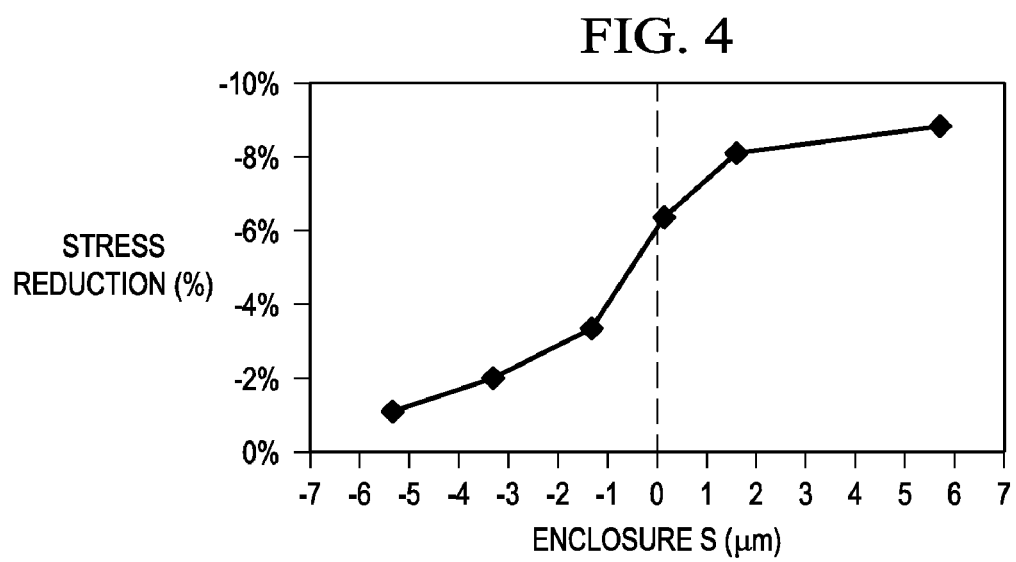

BOND PAD DESIGN FOR REDUCING THE EFFECT OF PACKAGE STRESS

This application claims the benefit of U.S. Provisional Application No. 61/232,076 filed on Aug. 7, 2009, entitled "Bond Pad Design for Reducing the Effect of Package Stress," which application is hereby incorporated herein by reference.

TECHNICAL FIELD

This invention relates generally to integrated circuits and more particularly to the structure and formation methods of bonding structures of integrated circuits.

BACKGROUND

Integrated circuit (IC) chips are often electrically connected to package substrates in packaging assemblies to provide external signal exchange. A commonly used bonding scheme is flip-chip bonding. FIG. 1 schematically illustrates a flip-chip bonding structure, wherein IC chip 100 is bonded onto package substrate 102 through bump balls 104. It is commonly observed, however, that the coefficient of thermal expansion (CTE) of IC chip 100 is significantly different from that of package substrate 102. For example, the CTE of IC chip 100 may be about 3 ppm/° C., while the CTE of package substrate 102 may be about 15 ppm/° C. Due to the difference in CTEs, stresses are generated inside IC chip 100 and package substrate 102, resulting in warpage, as is schematically illustrated in FIG. 2.

The warpage results in the cracking of bump balls 104 and the delamination of low-k dielectric layers (not shown) in IC chip 100. Currently, many processes use low-k and ultra low-k dielectric materials in inter-metal dielectric (IMD) layers to reduce RC delay and parasitic capacitances. The general trend in IMD designs is that the dielectric constants (k) of the IMD layers tend to decrease from low-k regime to ultra low-k regime. This means that the IMD layers, in which metal lines and vias are formed, are more mechanically fragile. Further, the IMD layers may delaminate when under the stress caused by the thermal expansion. The bump cracking and delamination are particularly severe at the corners of IC chip 100. Although conventionally, underfill is used to fill the space between IC chip 100 and bump balls 104 in order to protect bump balls 104, bump cracking and delamination were still being observed.

SUMMARY

In accordance with one aspect of the embodiment, an integrated circuit structure includes a semiconductor substrate, and an active device formed at a front surface of the semiconductor substrate. A bond pad is over the front surface of the semiconductor substrate. The bond pad has a first dimension in a first direction parallel to the front surface of the semiconductor substrate. A bump ball is over the bond pad, wherein the bump ball has a diameter in the first direction, and wherein an enclosure of the first dimension and the diameter is greater than about −1 μm.

Other embodiments are also disclosed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 and 2 illustrate cross-sectional views of a conventional flip-chip package assembly;

FIG. 4 illustrates simulation results indicating the relationship between stress reduction and enclosure.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the embodiments.

Figure 3A:
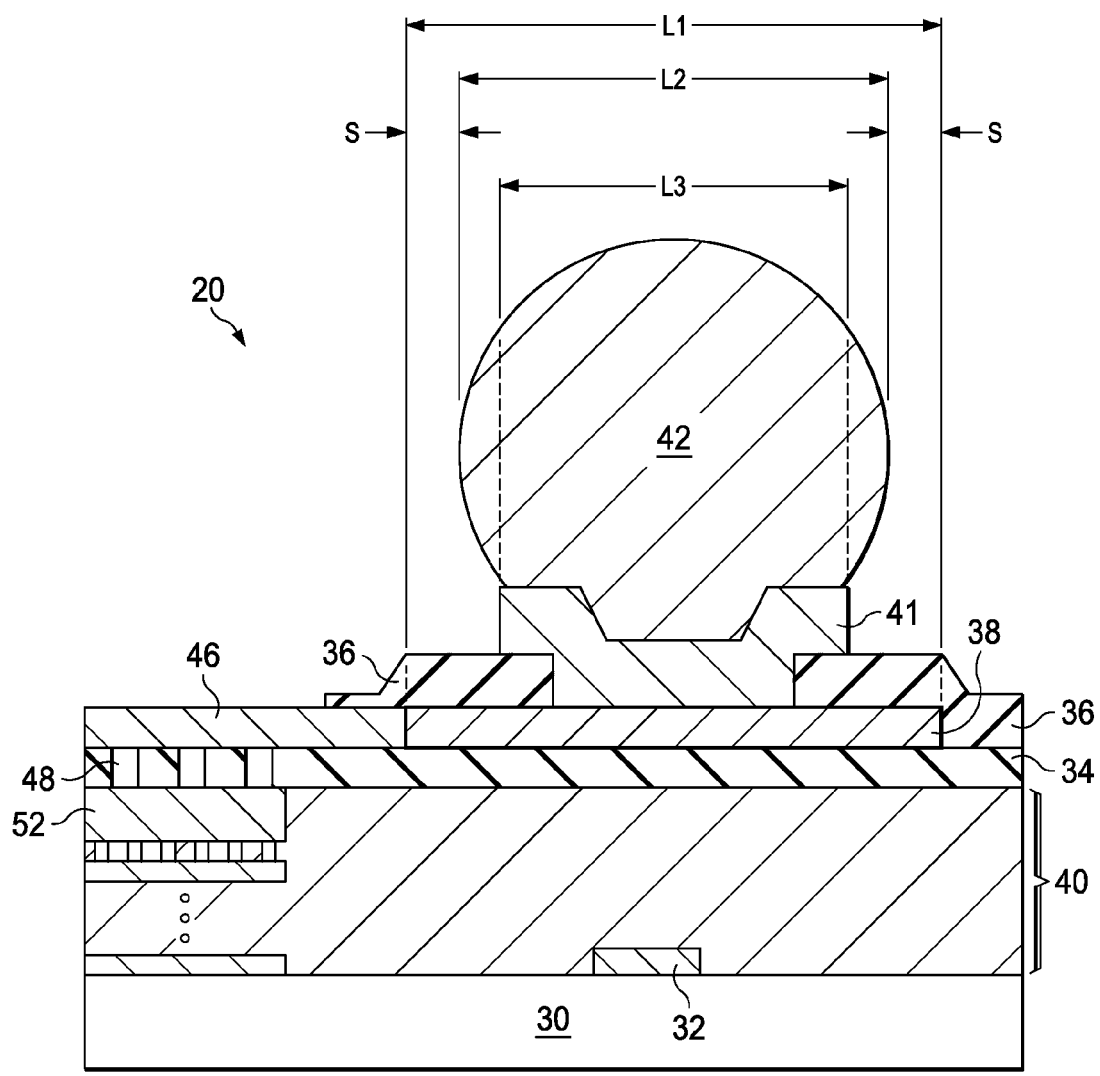
FIGS. 3A and 3B illustrate a cross-sectional view and a top view, respectively, of an embodiment.

FIG. 3A illustrates a cross-sectional view showing chip (or wafer) 20, which includes substrate 30, on which active circuit 32 is formed. Substrate 30 may be a semiconductor substrate formed of commonly used semiconductor materials such as silicon, silicon germanium, or the like. Active circuit 32 may include complementary metal-oxide-semiconductor (CMOS) transistors, resistors, capacitors, and the like. Interconnect structure 40 is formed over active 32, and is used to interconnect portions of active circuit 32, and to connect active circuit 32 to bond pads 38. Interconnect structure 40 includes a plurality of metallization layers comprising metal lines and vias (not shown). The metallization layers include a top dielectric layer in which metal pad 52 is formed, and the top dielectric layer may be formed of un-doped silicate glass or low-k dielectric materials. Metal pads 52 may be electrically coupled to bond pad 38 through vias 48.

Passivation layers 34 and 36 are formed over substrate 30 and also over interconnect structure 40. Passivation layers 34 and 36 are commonly referred to in the art as being passivation-1 and passivation-2, respectively, and may be formed of materials such as silicon oxide, silicon nitride, un-doped silicate glass (USG), polyimide, and/or multi-layers thereof. Bond pad 38 is formed over passivation layer 34. Further, bond pad 38 may be level with a lower portion of passivation layer 36 and directly underlying an opening in an upper portion of passivation layer 36. Bond pad 38 may be formed of aluminum, and hence may also be referred to as aluminum pad 38, although it may also be formed of, or include, other materials such as copper, silver, gold, nickel, tungsten, alloys thereof, and/or multi-layers thereof. Bond pad 38 may be electrically connected to active circuit 32, for example, through underlying interconnection structure 40. Further, bond trace 46, which is formed of a same material as, and formed simultaneously as, bond pad 38, may be used to connect bond pad 38 to interconnect structure 40.

An opening is formed in passivation layer 36 and exposing bond pad 38 through the opening. Under-bump metallurgy (UBM) 41 then fills the opening and contacts bond pad 38. In an embodiment, UBM 41 is formed of composite layers comprising a titanium layer, a copper layer over the titanium layer, and a nickel layer over the copper layer. In other embodiments, UBM 41 may include other metals, such as gold. UBM 41 may include a portion level with the upper portion of passivation layer 36 and portions over passivation layer 36.

Bump ball 42 is formed over and electrically connected to, and possibly contacting, UBM 41. Bump ball 42 may be formed of an eutectic solder, a lead-free solder, or the like. After a re-flow is performed on bump ball 42, bump ball 42 has a spherical upper portion, with the size and the shape of the lower portion being defined by the size and the shape of UBM 41, respectively. The top portion of bump ball 42 is also spherical.

Bond pad 38 has a horizontal dimension L1, which is measured in a plane (and hence all directions in the plane are referred to as in-plane directions hereinafter) parallel to the front surface (the surface facing up in FIG. 3A) of substrate 30. Further, UBM 41 has dimension L3, and bump ball 42 has diameter L2, both are measured in the same direction as the direction of horizontal dimension L1 (for example, the X-direction or the Y-direction in FIG. 3B). Throughout the description, the value (L1-L2) is referred to as enclosure S. A positive enclosure S indicates that dimension L1 is greater than diameter L2, while a negative enclosure S indicates that dimension L1 is less than diameter L2. The significance of the enclosure S is discussed in subsequent paragraphs. To reduce the adverse effect of the warpage, bond pad 38 is preferably large. In an embodiment, dimension L1 of bond pad 38 is greater than dimension L3 of UBM 41. Further, enclosure S may be greater than about −1 μm, greater than about 0 μm, or even greater than about 1.5 μm. Alternatively, dimension L1 may be greater than about −2.5 percent, greater than about 0 percent, or even greater than about 3.75%, of diameter L2.

Figure 3B:
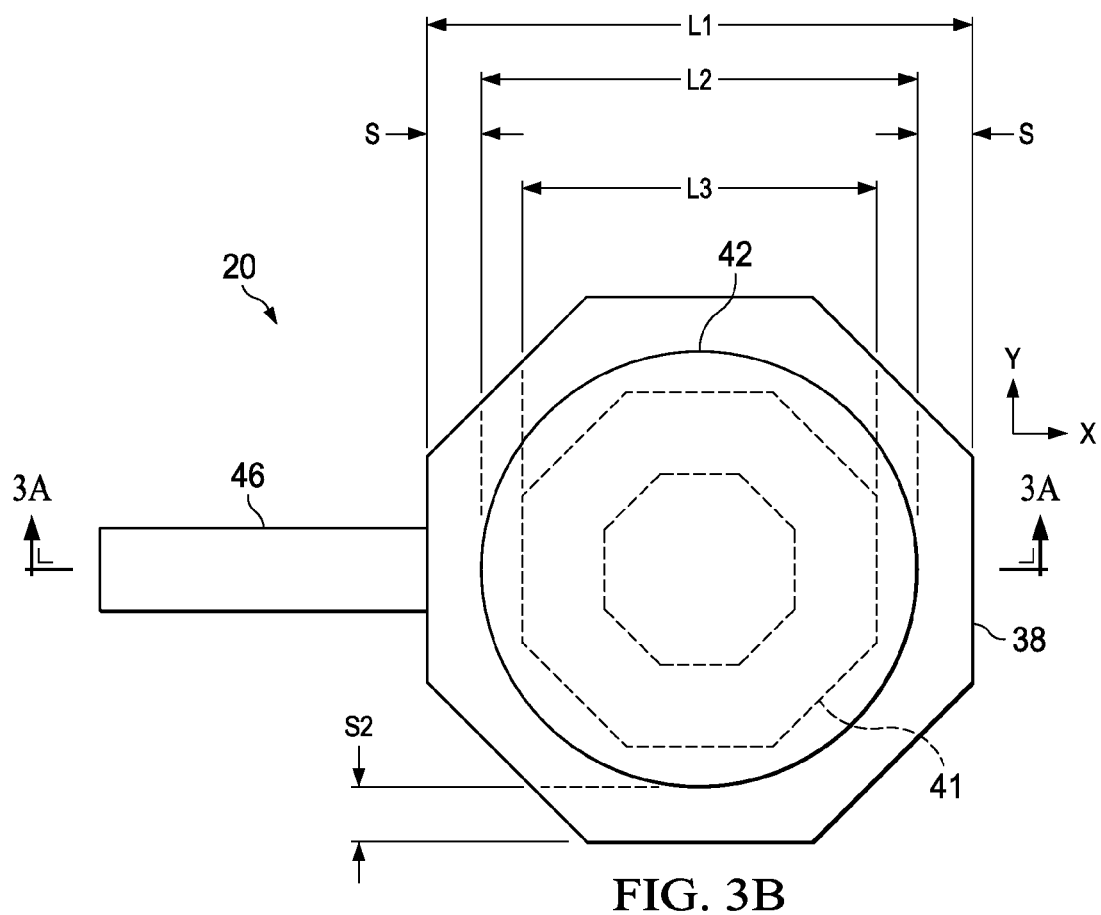

FIG. 3B illustrates a top view of the structure shown in FIG. 3A, wherein the cross-sectional view of FIG. 3A is taken along a plane crossing line 3A-3A in FIG. 3B. The boundaries of various features are illustrated in both FIGS. 3A and 3B so that corresponding features may be identified. Enclosure S may include enclosure S1 in the X-direction and enclosure S2 in the Y-direction (wherein the X-direction and the Y-direction may be parallel to edges of the respective chip 20). Both enclosures S1 and S2, or only one of enclosures S1 and S2, may be greater than about −1 μm, greater than 0 μm, or greater than about 1.5 μm.

The significance of the required enclosure S is explained using the simulation results shown in FIG. 4. After chip 20 is bonded (using flip-chip bonding) onto a package substrate through bump ball 42, a stress is generated and exerted on bump ball 42, and the stress will be imparted to interconnect structure 40 through bond pad 38, and potentially causing the delamination of low-k dielectric layers in interconnect structure 40. Simulations were made to study the principle stress in interconnect structure 40. The simulation results are illustrated in FIG. 4, wherein the Y-axis indicates the stress reduction in interconnect structure 40 as a function of enclosure S. The stress reduction is calculated using the stress of a structure with enclosure S (FIG. 3A) equal to −7 μm as a baseline. The simulation results revealed that if the enclosure S is negative, meaning dimension L1 (FIGS. 3A and 3B) is less than diameter L2, the stress reduction is relatively less, indicating relatively high stresses in interconnect structure 40 and relatively high possibilities of delamination in dielectric layers. When enclosure S increases toward positive values, the stress reduction increases (with more negative values), indicating a lower possibility of delamination. However, the stress reduction starts to saturate when enclosure S is greater than certain values, for example, about 2 μm to 3 μm. An unexpected result is incurred when enclosure S is greater than about −1 μm, wherein the stress reduction increases significantly with the increase in enclosure S.

FIG. 4 indicates that the size of bond pad 38 strongly affects the reliability of the flip-chip package. The reason is that, as discussed in preceding paragraphs, after chip 20, shown in FIG. 3A, is bonded to the package substrate (not shown), stresses are generated due to the difference between the coefficient of thermal expansion (CTE) of chip 20 and the CTE of the package substrate. FIG. 4 reveals that by increasing the size of bond pad 38, less stress is imparted to interconnect structure 40, and hence the reliability of the resulting package is improved.

Figure 5:
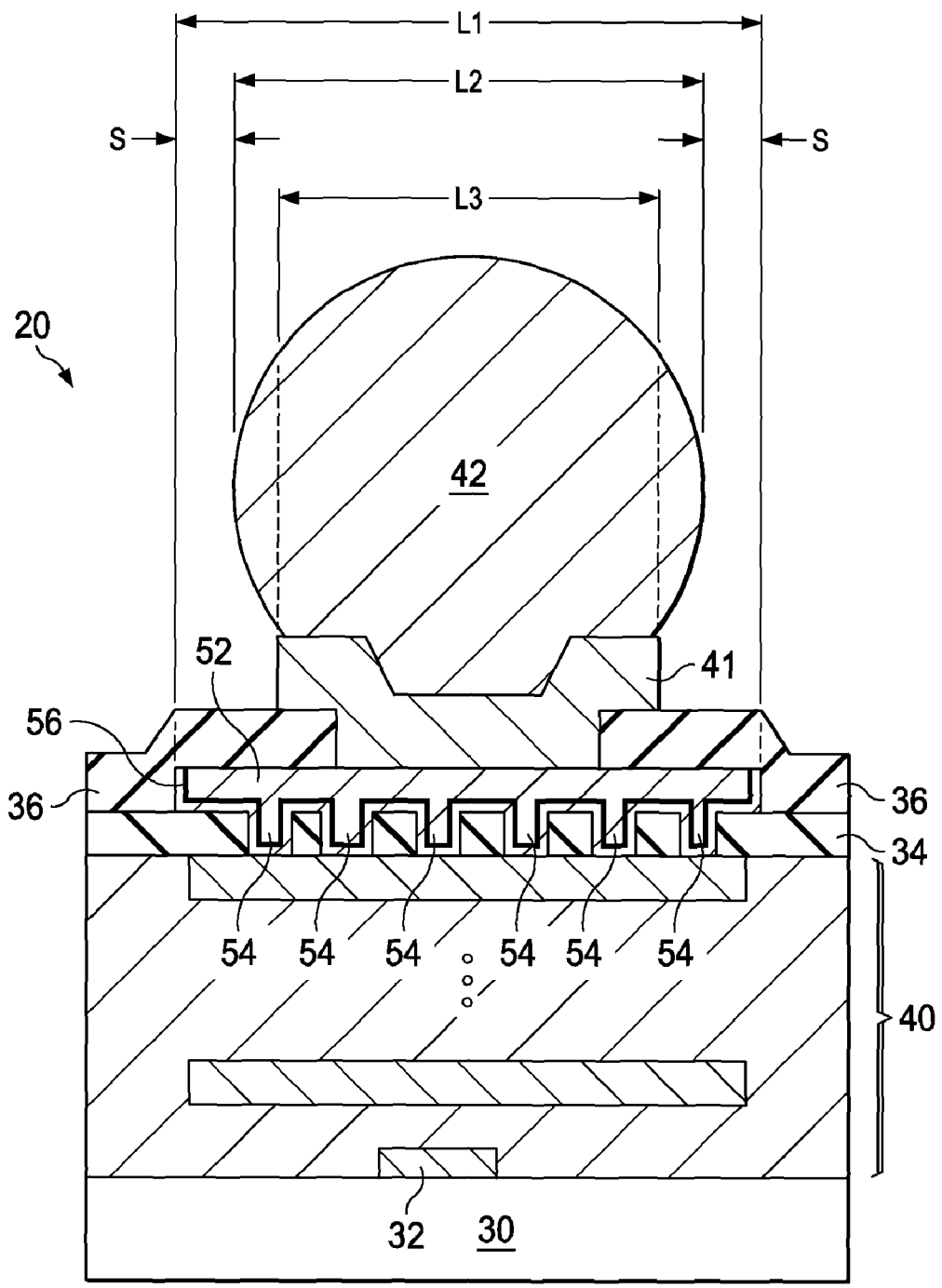
FIG. 5 illustrates a cross-sectional view of a package assembly in accordance with an alternative embodiment.

FIG. 5 illustrates an alternative embodiment, wherein top metal pad 52 acts as a bond pad. Top metal pad 52 may have essentially the same shape and the same size as bond pad 38, as shown in FIGS. 3A and 3B. Accordingly, enclosure S may also be greater than about (−1) μm, greater than about 0 μm, or even greater than about 1.5 μm. Vias 54 may be formed directly under top metal pad 52 and under bump ball 42. Top metal pad 52 and vias 54 may be formed using a dual damascene process. Further, diffusion barrier 56 may be formed as a part of top metal pad 52 and vias 54, and extends continuously from sidewalls of top metal pad 52 to sidewalls of vias 54.

The embodiments of the present invention have several advantageous features. By increasing the sizes of bond pads, the stresses exerted to the interconnect structure in semiconductor chips are reduced. The reduction in the usage of the chip area, however, requires no additional lithography steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor substrate;
   an active device formed at a front surface of the semiconductor substrate;
   a bond pad over the front surface of the semiconductor substrate, wherein the bond pad has a first dimension in a first direction parallel to the front surface of the semiconductor substrate, and a second dimension in a second direction, wherein the second direction is parallel to the front surface of the semiconductor substrate and perpendicular to the first direction; and
   a bump ball over the bond pad, wherein the bump ball has a diameter in the first direction, wherein an enclosure of the first dimension and the diameter is greater than about −1 μm, and wherein an additional enclosure of the second dimension and the diameter is greater than about −1 μm.

2. The integrated circuit structure of claim 1, wherein the diameter is greater than the first dimension.

3. The integrated circuit structure of claim 2, wherein the enclosure is greater than about 1.5 μm.

4. The integrated circuit structure of claim 1 further comprising an under-bump metallurgy (UBM) between and contacting the bump ball and the bond pad.

5. The integrated circuit structure of claim 4, wherein the UBM has a second dimension in the first direction and less than the first dimension.

6. The integrated circuit structure of claim 1, wherein a top portion of the bump ball has a spherical shape.

7. The integrated circuit structure of claim 1 further comprising:
a first passivation layer underlying the bond pad;
a second passivation layer comprising a first portion level with the bond pad, and a second portion over the bond pad;
an opening in the second portion of the second passivation layer, wherein the bond pad comprises a central portion exposed through the opening; and
a UBM comprising a first portion in the opening and contacting the bond pad, and a second portion over the second portion of the second passivation layer.

8. The integrated circuit structure of claim 1, wherein the bond pad comprises aluminum.

9. The integrated circuit structure of claim 1 further comprising a via underlying and contacting the bond pad, wherein the via and the bond pad form a dual damascene structure.

10. An integrated circuit structure comprising:
a semiconductor substrate;
a first passivation layer over the semiconductor substrate;
a bond pad over the first passivation layer, wherein the bond pad has a first dimension in a first direction parallel to a front surface of the semiconductor substrate,
a second passivation layer comprising a first portion level with the bond pad, and a second portion over the bond pad;
an opening in the second portion of the second passivation layer;
an under-bump metallurgy (UBM) comprising a first portion filling the opening and contacting the bond pad, and a second portion over the second portion of the second passivation layer; and
a bump ball over the bond pad, wherein the bump ball has a diameter measured in the first direction, wherein the diameter is greater than the first dimension, with a difference between the diameter and the first dimension being smaller than about 1 μm.

11. The integrated circuit structure of claim 10, wherein the UBM has a second dimension in the first direction and less than the first dimension.

12. The integrated circuit structure of claim 10, wherein a top portion of the bump ball has a spherical shape.

13. The integrated circuit structure of claim 10, wherein the bond pad comprises aluminum.

14. The integrated circuit structure of claim 10 further comprising a via underlying and contacting the bond pad, wherein the via and the bond pad form a dual damascene structure.

15. The integrated circuit structure of claim 1, wherein the bond pad extends horizontally beyond the bump ball in all in-plane directions parallel to the front surface of the semiconductor substrate.

* * * * *